US012733089B2

(12) United States Patent
Rajasekar et al.

(10) Patent No.: US 12,733,089 B2
(45) Date of Patent: Sep. 8, 2026

(54) PCB FABRICATION WITH EMI FILM ON MULTI-LAYER RIGID PCB

(71) Applicant: Intel Corporation, Santa Clara, CA (US)

(72) Inventors: Arumanayagam Rajasekar, Nagercoil (IN); Hariharan Kaliyavarathan, Villupuram (IN); Srinivas Reddy B.M., Bangalore (IN); Yagnesh Vinodrai Waghela, Bengaluru (IN); Piyush Bhatt, Bangalore (IN)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 18/123,049

(22) Filed: Mar. 17, 2023

(65) Prior Publication Data

US 2024/0314923 A1 Sep. 19, 2024

(51) Int. Cl.
*H05K 1/02* (2006.01)

(52) U.S. Cl.
CPC ... *H05K 1/0224* (2013.01); *H05K 2201/2081* (2013.01)

(58) Field of Classification Search
CPC .................... H05K 1/0224; H05K 2201/2081
USPC .......................................................... 361/748
See application file for complete search history.

(56) References Cited

U.S. PATENT DOCUMENTS

| | | | |
|---|---|---|---|
| 6,781,849 B2 * | 8/2004 | Baek | H10W 90/00 361/720 |
| 2023/0262874 A1 * | 8/2023 | Gonzalez | H05K 1/112 361/783 |

* cited by examiner

*Primary Examiner* — Andargie M Aychillhum
(74) *Attorney, Agent, or Firm* — Schwabe, Williamson & Wyatt, P.C.

(57) ABSTRACT

Embodiments disclosed herein include a printed circuit board (PCB). In an embodiment, the PCB comprises a core and routing layers over and under the core. In an embodiment, a multi-layer shield is over at least one of the routing layers. In an embodiment, the multi-layer shield comprises a metallic layer with a first surface and a second surface opposite from the first surface, and a conductive adhesive over the first surface of the metallic layer. In an embodiment, a base layer is over the second surface of the metallic layer, where the base layer is electrically insulating.

20 Claims, 12 Drawing Sheets

PCB FABRICATION WITH EMI FILM ON MULTI-LAYER RIGID PCB

TECHNICAL FIELD

Embodiments of the present disclosure relate to electronic systems, and more particularly to printed circuit boards (PCBs) with improved electromagnetic interference (EMI) shielding.

BACKGROUND

Component placement and signal routings are determined based on a variety of factors, where electromagnetic interference (EMI) and/or radio frequency interference (RFI) are two important parameters to be considered. The layer count is increased due to the need for EMI ground in the outer layers. Further, there are limitations in routing high speed signals and providing high switching power shapes on the outer layer which are sources of EMI/RFI issues. This requires additional shielding provisions in the design of the board.

EMI and RFI issues may be fixed through the inclusion of additional metal shield soldering. EMI shielding may include conductive tape, graphene, EM clock tape, absorber materials, and the like. However, all of these shielding options are applied with post surface mount technology (SMT) processes. Further, EMI metal shields require metallic material which adds costs and additional SMT processes. Materials, such as EMI absorber tape, EM clock, and graphene materials add costs and additional manual processing after SMT operations. The inclusion of additional shielding layers also increases the Z-height of the system. Particularly, it may be necessary to increase the layer count by two layers in order to provide grounding to the outer EMI layers. Even when used, such EMI shielding architectures are not 100% EMI leakage proof.

EMBODIMENTS OF THE PRESENT DISCLOSURE

Figure 1B:
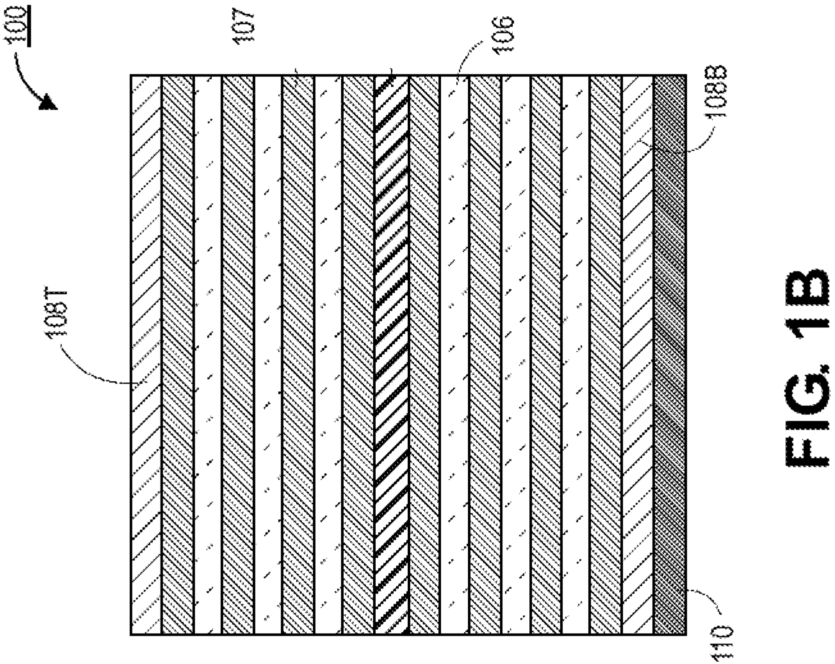
FIG. 1B is a cross-sectional schematic illustration of a board with a core, routing layers, solder resist, and an EMI shield under the bottom solder resist, in accordance with an embodiment.

Described herein are electronic systems, and more particularly to printed circuit boards (PCBs) with improved electromagnetic interference (EMI) shielding, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, electromagnetic interference (EMI) can cause significant problems for the manufacture of printed circuit board (PCBs), such as motherboards and the like. Currently, extra routing layers (e.g., two extra layers) are needed in order to enable the routing of high speed and high switching power shapes on the outer layers. The addition of extra layers results in significant increases in the cost of the board, as well as increasing the total Z-height of the board.

Accordingly, embodiments disclosed herein include the use of a multi-layer EMI shield (also referred to as a "multi-layer shield" or simply a "shield" herein). The shield may include a thin metallic layer, such as copper. A conductive adhesive may be provided over the metallic layer in order to mechanically and electrically couple the metallic layer to one or more ground pads exposed in openings through the solder resist layer. An electrically insulating base layer may then be provided over the opposite side of the metallic layer in order to electrically isolate the metallic layer from the external environment.

The use of such multi-layer EMI shields allow for several advantages. One such advantage is a reduction in Z-height of the board. Generally, the multi-layer shield may have a total thickness of up to approximately 20 μm, or up to approximately 15 μm. This is significantly less than the added thickness for a pair of additional routing layers (which can increase the Z-height by up to approximately 100 μm). As used herein, "approximately" may refer to a range of values that is within ten percent of the stated value. For example, approximately 20 μm may refer to a range from 18 μm to 22 μm.

The multi-layer EMI shields are applied with pre-SMT process. That is, the multi-layer shield can be placed before external components are mounted. For example, openings through the multi-layer shield can be used to accommodate the discrete components (e.g., capacitors, inductors, other passives, other active components, or the like). More particularly, the multi-layer shield eliminates additional SMT and/or manual processes that have been used in order to enable other EMI reduction architectures, such as those described in greater detail above.

Embodiments disclosed herein also provide high performance shielding. For example, up to 90% shielding, up to 95% shielding, or up to 99% shielding of the EMI may be provided when certain embodiments are used. This enables the routing of high speed signals and providing high switching power shapes on the outer layers of the board.

Figure 1A:
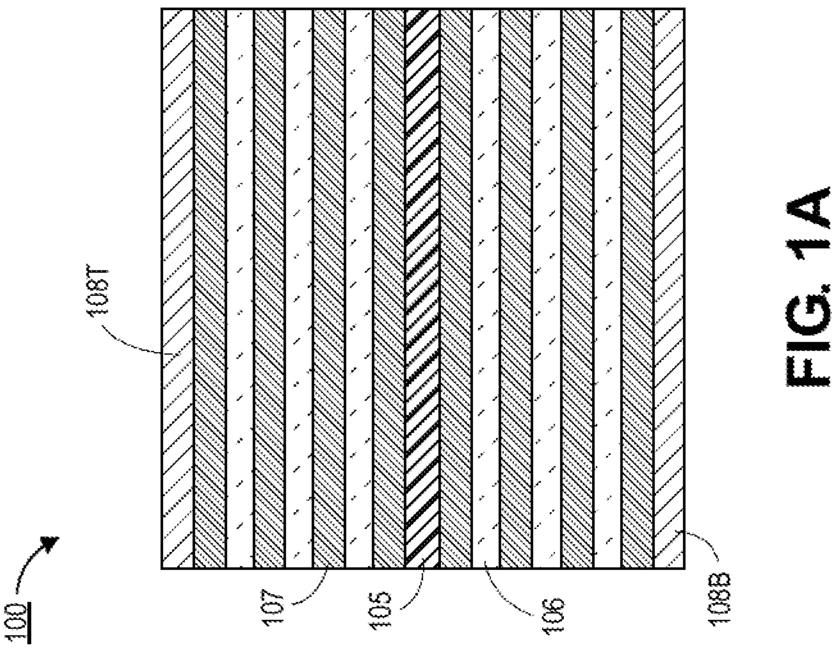
FIG. 1A is a cross-sectional schematic illustration of a board with a core, routing layers and solder resist over the top and bottom of the board, in accordance with an embodiment.

Referring now to FIG. 1A, a cross-sectional schematic illustration of a board 100 is shown, in accordance with an embodiment. In the schematic, monolithic layers are illustrated for simplicity. In actuality, electrical traces, vias, pads, etc. may be provided between layers and interconnected with each other, as is common in board manufacturing environments. In an embodiment, the board 100 may comprise a core 105. The core 105 may include an organic core material, a glass core material, or any other suitable core material. A plurality of routing layers 107 may be provided above and below the core 105. For example, four routing layers 107 are provided above and below the core 105. The routing layers 107 may comprise traces, pads, and the like. The traces and pads may be connected between layers by vias that pass through insulating layers 106. The routing layers 107 and the insulating layers 106 may comprise rigid board materials. For example, routing layers 107 and insulating layers 106 may comprise FR3 or FR4 type organic glass fiber reinforced materials or the like. In an embodiment, a top solder resist 108T and a bottom solder resist 108B are provided over the topmost routing layer 107 and the bottommost routing layer 107.

Referring now to FIG. 1B, a cross-sectional schematic illustration of a board 100 is shown, in accordance with an additional embodiment. In an embodiment, the board 100 in FIG. 1B may be substantially similar to the board 100 in FIG. 1A, with the exception of the inclusion of a multi-layer EMI shield 110 being provided under the bottom solder resist 108B. While shown as a single monolithic layer in FIG. 1B, it is to be appreciated that the shield 110 may include a plurality of different layers (e.g., conductive adhesive, metallic layer, insulating base layer, etc.) which will be described in greater detail below. In an embodiment, the electrically conductive portion of the shield 110 may be electrically coupled to one or more grounded features in the bottommost routing layer 107. That is, openings through the solder resist 108B may be provided in order to electrically couple the routing layer 107 to the shield 110.

Figure 1D:
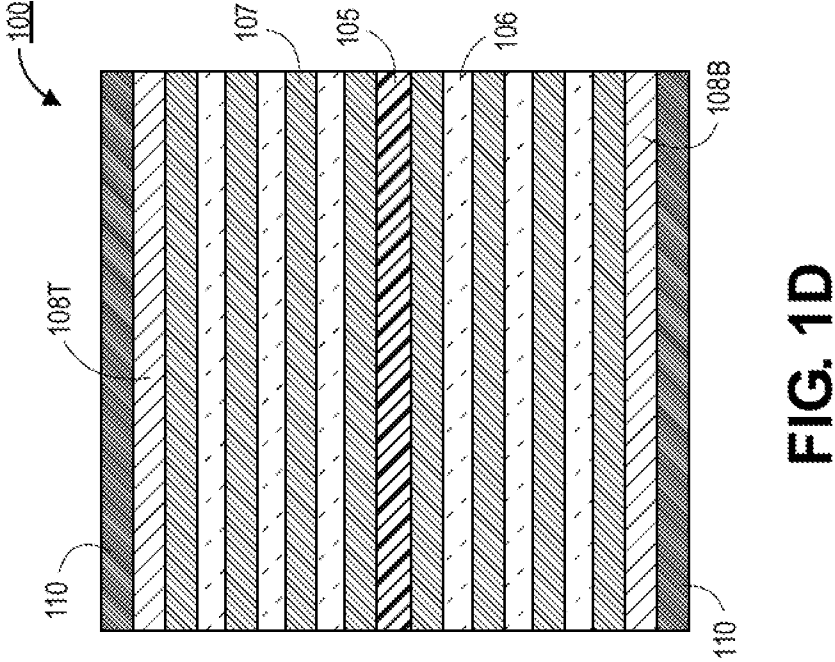
FIG. 1D is a cross-sectional schematic illustration of a board with a core, routing layers, solder resist, and EMI shields over the top solder resist and the bottom solder resist, in accordance with an embodiment.
Figure 1C:
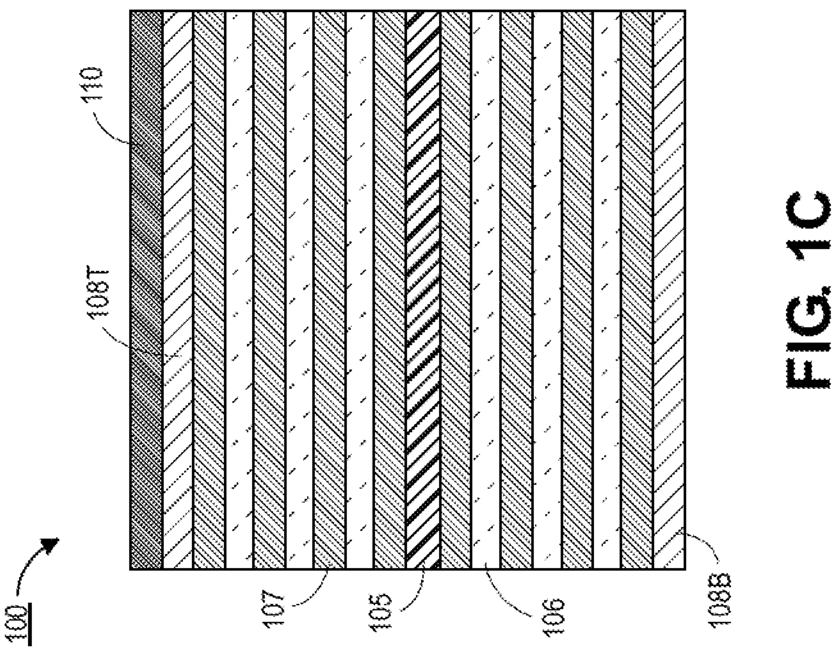
FIG. 1C is a cross-sectional schematic illustration of a board with a core, routing layers, solder resist, and an EMI shield over the top solder resist, in accordance with an embodiment.

Referring now to FIG. 1C, a cross-sectional illustration of a board 100 is shown, in accordance with an additional embodiment. The board 100 in FIG. 1C may be substantially similar to the board 100 in FIG. 1A, with the exception of the inclusion of a multi-layer EMI shield 110 being provided over the top solder resist 108T. While shown as a single monolithic layer in FIG. 1C, it is to be appreciated that the shield 110 may include a plurality of different layers (e.g., conductive adhesive, metallic layer, insulating base layer, etc.) which will be described in greater detail below. In an embodiment, the electrically conductive portion of the shield 110 may be electrically coupled to one or more grounded features in the topmost routing layer 107. That is, openings through the solder resist 108T may be provided in order to electrically couple the routing layer 107 to the shield 110.

Referring now to FIG. 1D, a cross-sectional illustration of a board 100 is shown, in accordance with yet another embodiment. The board 100 in FIG. 1D may be substantially similar to the board 100 in FIG. 1A, with the exception of the inclusion of a multi-layered EMI shield 110 being provided both over the top solder resist 108T and under the bottom solder resist 108B. The shields 110 may be multi-layer shields with an electrically conductive adhesive and a metallic layer. An insulating base layer may be provided to electrically isolate the metallic layer from the external environment. In an embodiment, the metallic layer is coupled to grounded features in the routing layers 107 through openings or vias in the solder resists 108T and 108B.

In the embodiments shown in FIGS. 1A-1D, the multi-layered EMI shields 110 are shown as having thicknesses that are substantially equal to the thickness of the insulating layers 106 and the routing layers 107. However, it is to be appreciated that the thicknesses of the shields 110 may be significantly smaller than that of the insulating layers 106 and the routing layers 107. For example, the shields 110 may have total thicknesses that are up to approximately 20 μm, or up to approximately 15 μm. As such, the addition of the one or more shields 110 does not significantly increase the Z-height of the boards 100. In contrast, adding one or more routing layers (as previously suggested) may increase the thickness of the boards 100 by up to approximately 100 μm in some instances. Accordingly, embodiments disclosed herein provide significant Z-height advantages over existing solutions.

Figure 2A:
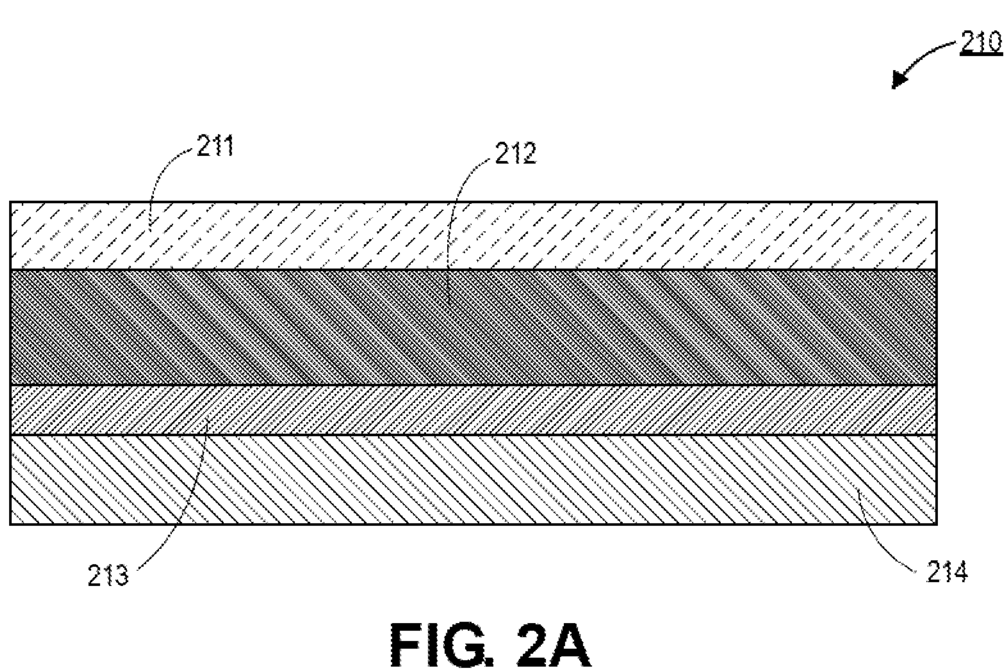
FIG. 2A is a cross-sectional illustration of a multi-layer EMI shield, in accordance with an embodiment.

Referring now to FIG. 2A, a cross-sectional illustration of a multi-layered EMI shield 210 is shown, in accordance with an embodiment. In an embodiment, the multi-layered EMI shield 210 may comprise a base layer 214. The base layer 214 may be an electrically insulating layer that protects the shield 210 from the external environment.

In an embodiment, a metallic layer 213 may be provided over the base layer 214. The base layer 214 may be a polymer material or the like. The base layer 214 may have a thickness that is up to approximately 10 μm. In a more particular embodiment, the base layer 214 may have a thickness of up to approximately 5 μm. The metallic layer 213 may comprise copper or any other suitable conductive material. The metallic layer 213 may have a thickness that is up to approximately 10 μm. In other embodiments, the metallic layer 213 has a thickness that is up to approximately 5 μm.

In an embodiment, a conductive adhesive layer 212 may be provided over the metallic layer 213. The conductive adhesive layer 212 may be any material that can mechanically couple the metallic layer 213 to a conductive feature, while also allowing for electrical coupling between the metallic layer 213 and the conductive features. In an embodiment, the thickness of the conductive adhesive layer 212 may be up to approximately 10 μm. Though, the conductive adhesive layer 212 may compress so that it has a thickness up to approximately 5 μm in some embodiments.

In an embodiment, the shield 210 may further comprise a removable layer 211. The removable layer 211 may be peeled off of the conductive adhesive layer 212 when the shield 210 is applied to the board. That is, the removable layer 211 does not contribute to the overall thickness of the board to which the shield 210 is attached. The removable layer 211 may be an electrically insulating material, such as a polymer sheet or the like.

Figure 2B:
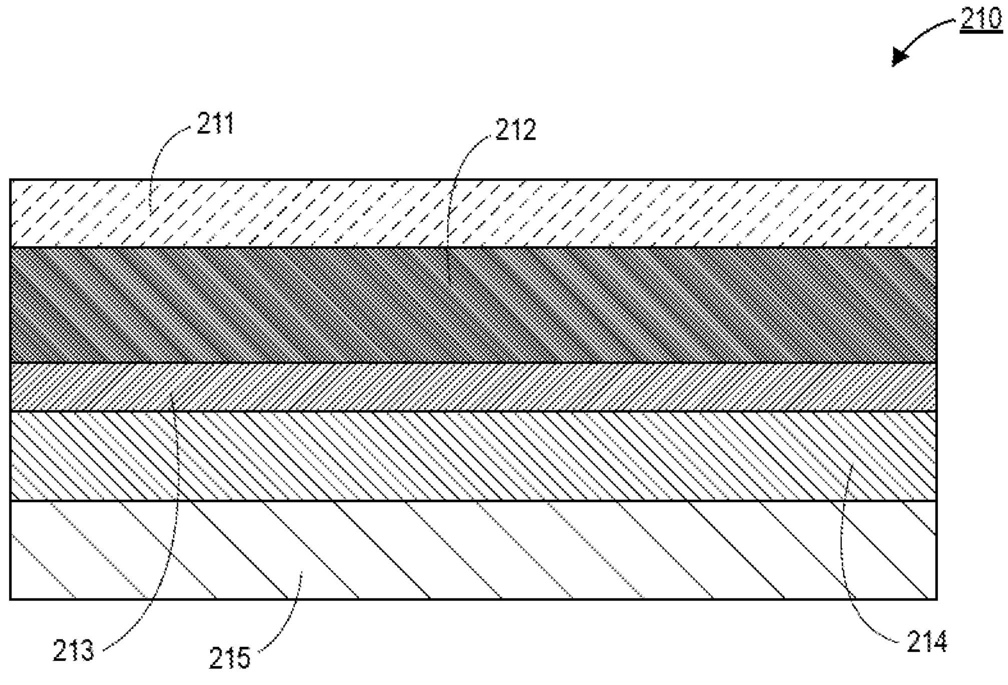
FIG. 2B is a cross-sectional illustration of a multi-layer EMI shield, in accordance with an additional embodiment.

Referring now to FIG. 2B, a cross-sectional illustration of a multi-layered EMI shield 210 is shown, in accordance with an additional embodiment. In an embodiment, the shield 210 may be substantially similar to the shield 210 shown in FIG. 2A, with the exception of an additional reinforcement film 215 provided under the base layer 214. The reinforcement film 215 may provide additional stiffness to the shield 210. Additionally, the reinforcement film 215 may be used to mitigate thermal shock of the shield 210 during temperature cycling operations, such as when the shield 210 is attached to the board. The reinforcement film 215 may be any suitable material, such as a polymer, an epoxy, or the like. The reinforcement film 215 may have a thickness that is similar to the thickness of the base layer 214. For example, the reinforcement film 215 may have a thickness that is up to approximately 15 μm thick, up to approximately 10 μm thick, or up to approximately 5 μm thick.

Figure 3A:
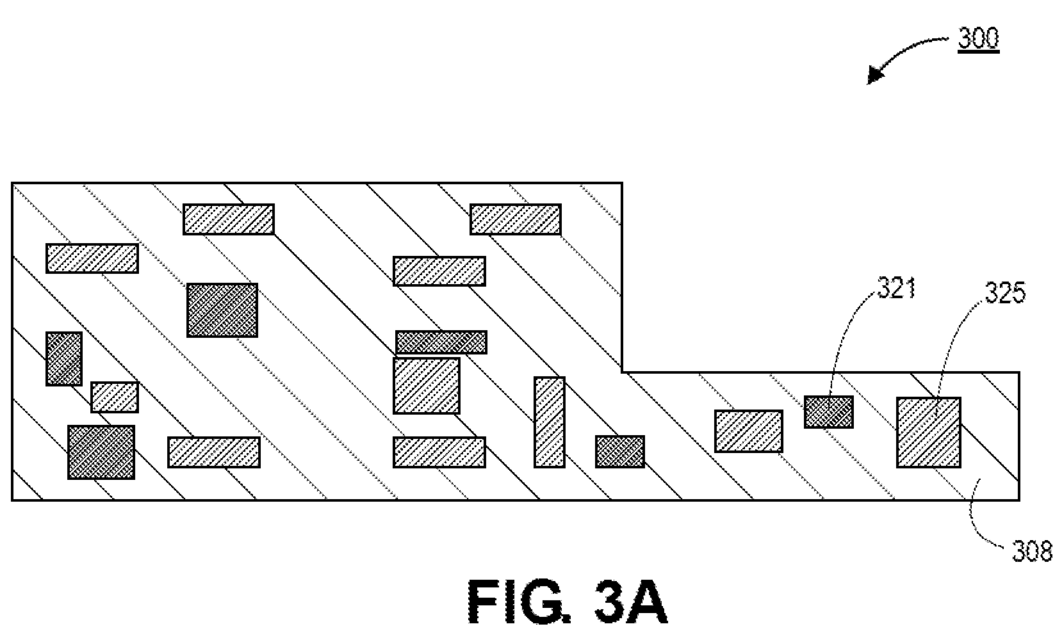
FIG. 3A is a plan view illustration of a surface of a solder resist layer with openings, in accordance with an embodiment.
Figure 3B:
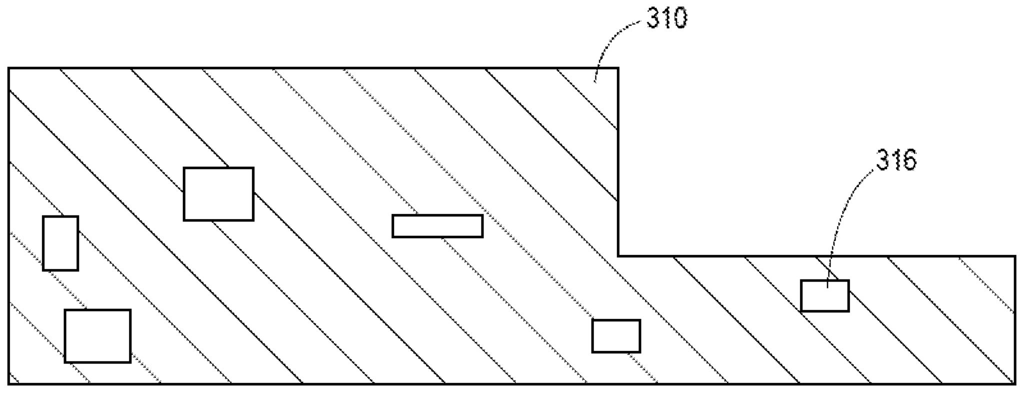
FIG. 3B is a plan view illustration of a multi-layer EMI shield with openings, in accordance with an embodiment.
Figure 3C:
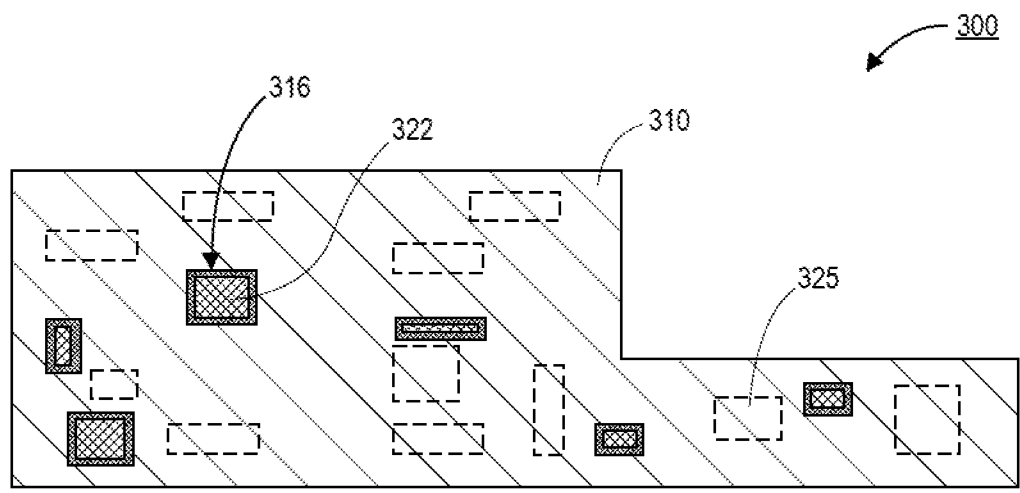
FIG. 3C is a plan view illustration of a board with the multi-layer EMI shield bonded to the solder resist layer, in accordance with an embodiment.

Referring now to FIGS. 3A-3C, a series of plan view illustrations depicting various layers of a board 300 is shown, in accordance with an embodiment. FIG. 3A shows the plan view of a solder resist layer 308. FIG. 3B shows the plan view of a multi-layer EMI shield 310, and FIG. 3C shows a plan view of the board 300 after the multi-layer EMI shield 310 is adhered to the board.

Referring now to FIG. 3A, a plan view illustration of a board 300 is shown, in accordance with an embodiment. In the illustrated embodiment, the board 300 comprises a solder resist 308. The solder resist 308 may be provided over layers such as routing layers (not shown) and insulating layers (not shown). For example, the board 300 may be similar to any of the boards 100 described above with respect to FIGS. 1A-1D.

In an embodiment, the solder resist 308 may comprise first openings that expose conductive features 325. The conductive features 325 may be metallic material in a routing layer underlying the solder resist 308. In an embodiment, the conductive features 325 may be electrically grounded features. In an embodiment, the solder resist 308 may comprise second openings that expose component pads 321. The component pads 321 may be locations where discrete components (e.g., capacitors, inductors, etc.) may be coupled to the board with SMT processes.

Referring now to FIG. 3B, a plan view illustration of a multi-layer EMI shield 310 is shown, in accordance with an embodiment. The shield 310 may include a plurality of different layers. For example, the shield 310 may be similar to any of the shields described above with respect to FIG. 2A or FIG. 2B. That is, the shield 310 may comprise a conductive adhesive, a metallic layer, and an insulating base layer. As shown, the footprint of the shield 310 may be substantially similar to the footprint of the board 300 in FIG. 3A. This allows for the shield 310 to be adhered over the board 300 in order to provide EMI shielding for the board 300. In an embodiment, the shield 310 may comprise openings 316. The openings 316 may be substantially aligned with the second openings in the board 300 that expose the component pads 321.

Referring now to FIG. 3C, a plan view illustration of the shield 310 attached to the board 300 is shown, in accordance with an embodiment. As shown, the shield 310 is provided over the solder resist 308 and the conductive features 325. The conductive features 325 are illustrated with dashed lines to indicate that the shield 310 covers and contacts the conductive features 325. In an embodiment, the shield 310 may electrically couple the conductive features 325 to the metallic layer by a conductive adhesive. The openings 316 may be provided in order to accommodate discrete devices 322 that are coupled to the component pads 321. The discrete devices 322 may be mounted to the board with a SMT process after the shield 310 is attached to the board 300.

Figure 4:
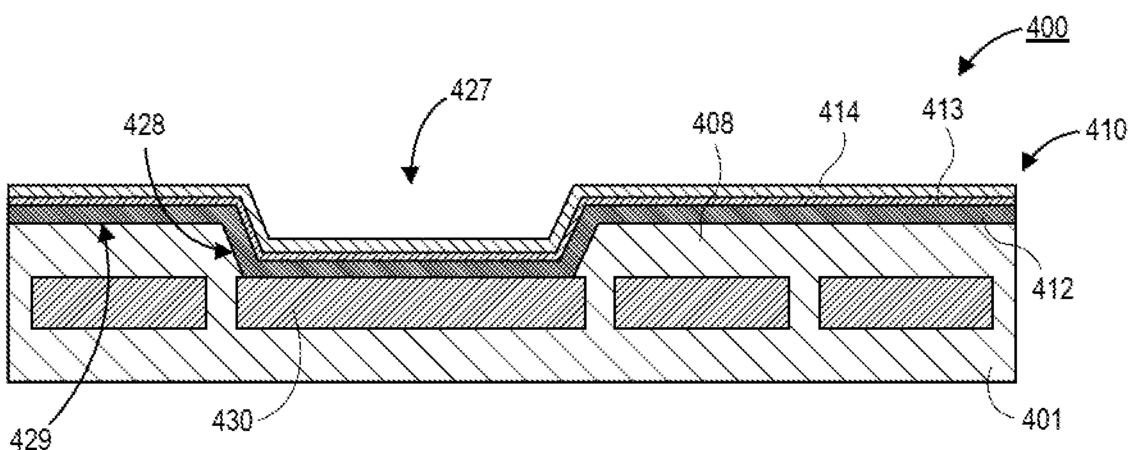
FIG. 4 is a cross-sectional illustration of a board with a multi-layer EMI shield that is electrically coupled to a ground pad below a solder resist layer, in accordance with an embodiment.

Referring now to FIG. 4, a cross-sectional illustration of a board 400 is shown, in accordance with an embodiment. In an embodiment, the board 400 may comprise a substrate 401. Conductive features 430 may be provided in the substrate 400. A solder resist 408 or the like may be provided over the conductive features 430. As shown, an opening 427 may be provided over one of the conductive features 430. In a particular embodiment, the conductive feature 430 exposed by the opening 427 is an electrically grounded feature.

In an embodiment, a multi-layer EMI shield 410 may be provided over the solder resist 408 and contact the conductive feature 430. The shield 410 may be over the top surface 429 of the solder resist 408 and over the sidewalls 428 of the solder resist 408 in the opening 427. The shield 410 may comprise an electrically conductive adhesive layer 412. The electrically conductive adhesive layer 412 may electrically couple the conductive feature 430 to the metallic layer 413, such as a copper layer. An electrically insulating base layer 414 may be provided over the metallic layer 413. In some embodiments, a reinforcement film (not shown) may be provided over the base layer 414.

Referring now to FIGS. 5A-5J, a series of plan view illustrations depicting a process for assembling a multi-layer EMI shield to a board is shown, in accordance with an embodiment.

Figure 5A:
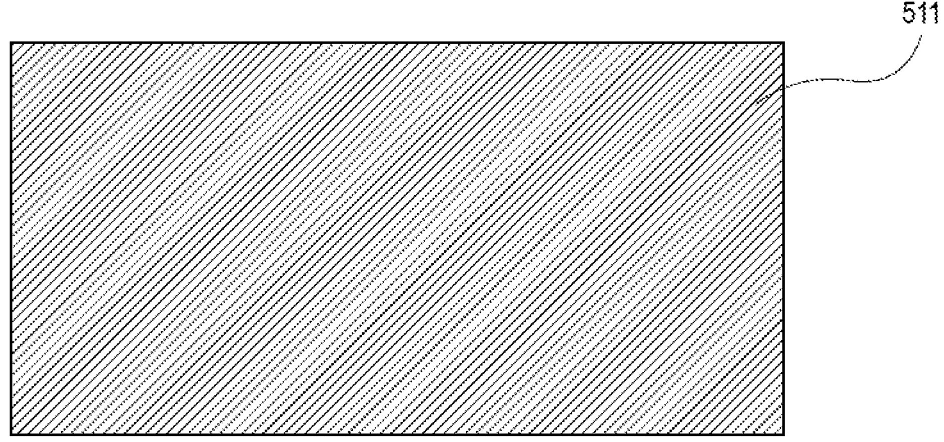
FIG. 5A is a plan view illustration of a carrier for a multi-layer EMI shield, in accordance with an embodiment.

Referring now to FIG. 5A, a plan view illustration of a carrier 511 is shown, in accordance with an embodiment. The carrier 511 may be a sheet of material onto which a multi-layer EMI shield is formed. The carrier 511 may be a releasable material from the EMI shield. For example, after the multi-layer EMI shield is adhered to the board, the carrier 511 may be removed with a peeling process or the like.

Figure 5B:
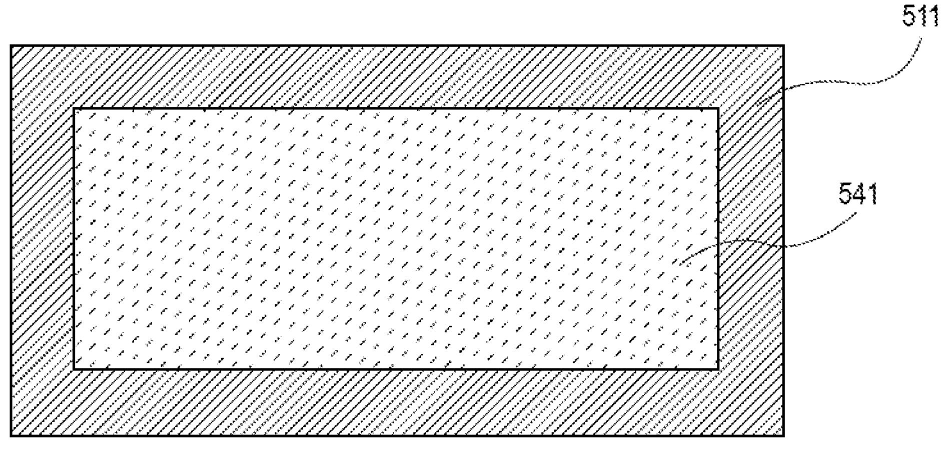
FIG. 5B is a plan view illustration of the carrier after a metallic layer is provided over the carrier, in accordance with an embodiment.

Referring now to FIG. 5B, a plan view illustration of the carrier 511 after a multi-layer sheet 541 is provided over the carrier 511 is shown, in accordance with an embodiment. In an embodiment, the multi-layer sheet 541 may include an electrically insulating base layer, a metallic layer, and a conductive adhesive layer. The multi-layer sheet 541 may have a footprint that is smaller than the footprint of the carrier 511. At this point, the multi-layer sheet 541 is not patterned.

Figure 5C:
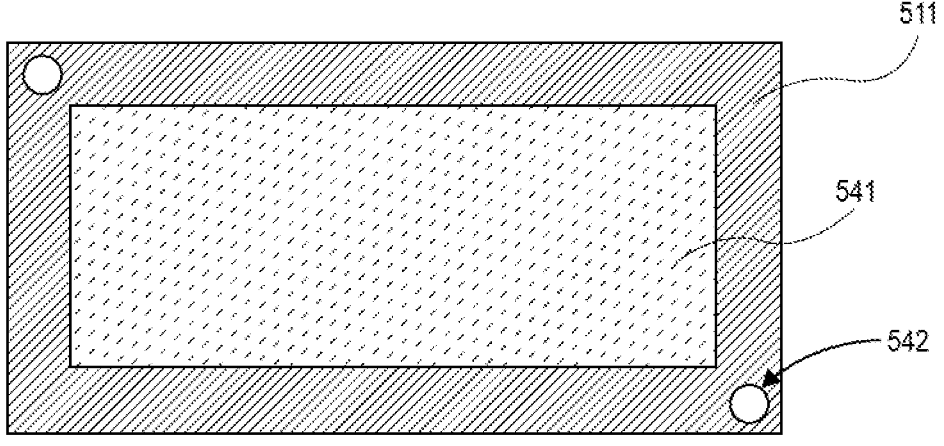
FIG. 5C is a plan view illustration of the carrier after alignment holes are formed in the carrier, in accordance with an embodiment.

Referring now to FIG. 5C, a plan view illustration of the carrier 511 after alignment holes 542 are provided into the carrier 511 is shown, in accordance with an embodiment. The alignment holes 542 may be formed with a laser drilling process, a mechanical drilling process, an etching process, or the like. In an embodiment, the alignment holes 542 are circular. Though, it is to be appreciated that the alignment holes 542 may be any suitable shape capable of providing an alignment with the board in a subsequent processing operation.

Figure 5D:
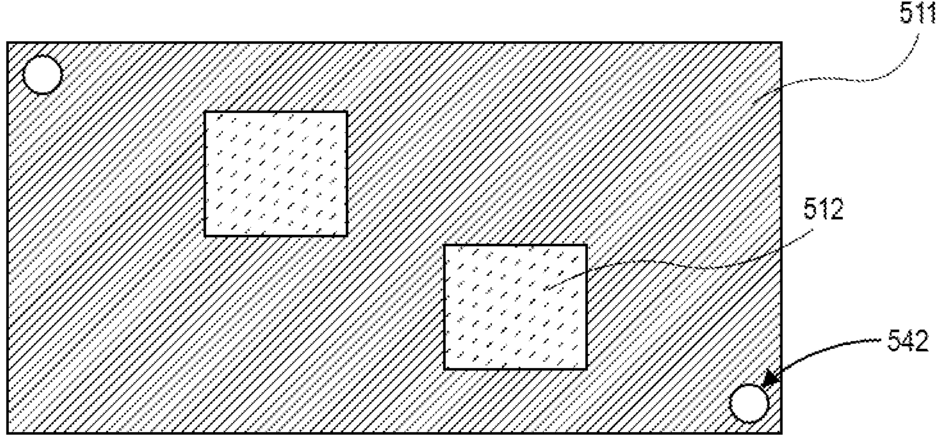
FIG. 5D is a plan view illustration of the carrier after the metallic layer is patterned to form a patterned metallic layer, in accordance with an embodiment.

Referring now to FIG. 5D, a plan view illustration of the carrier 511 after the sheet 541 is patterned is shown, in accordance with an embodiment. As shown, the patterned sheet 541 forms a one or more conductive adhesive layers 512 that take the shape of the desired electrical shielding for the board. While shown as a pair of boxes, it is to be appreciated that the patterned adhesive layers 512 may take any form, including a plan view similar to what is shown in FIG. 3B above. That is, the adhesive layers 512 may include holes for component placement and the like. In an embodiment, the sheet 541 may be patterned with any suitable process, such as laser ablation, etching, or the like.

Figure 5E:
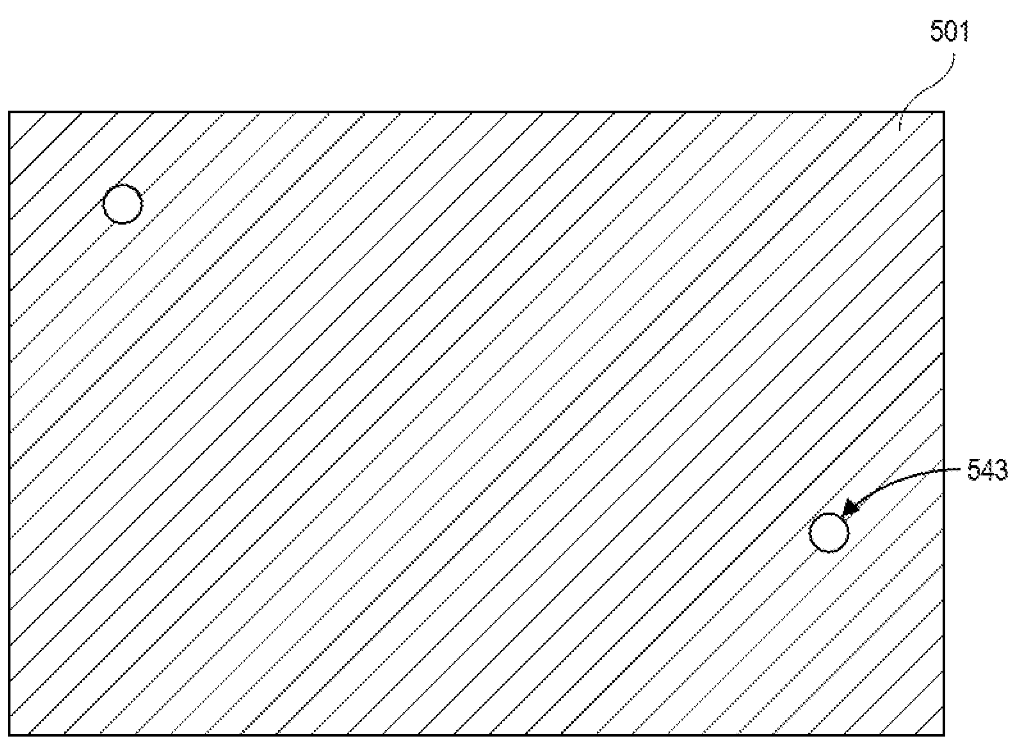
FIG. 5E is a plan view illustration of a board with alignment holes, in accordance with an embodiment.

Referring now to FIG. 5E, a plan view illustration of a board 501 is shown, in accordance with an embodiment. The board 501 may include substrate layers such as a core, routing layers, and insulating layers. The board 501 may be similar to any of the board architectures described in greater detail above. In an embodiment, the board 501 may include alignment holes 543. The alignment holes 543 may be used in conjunction with the alignment holes 542 on the carrier 511 in order to properly align the multi-layer EMI shield with the board 501.

Figure 5F:
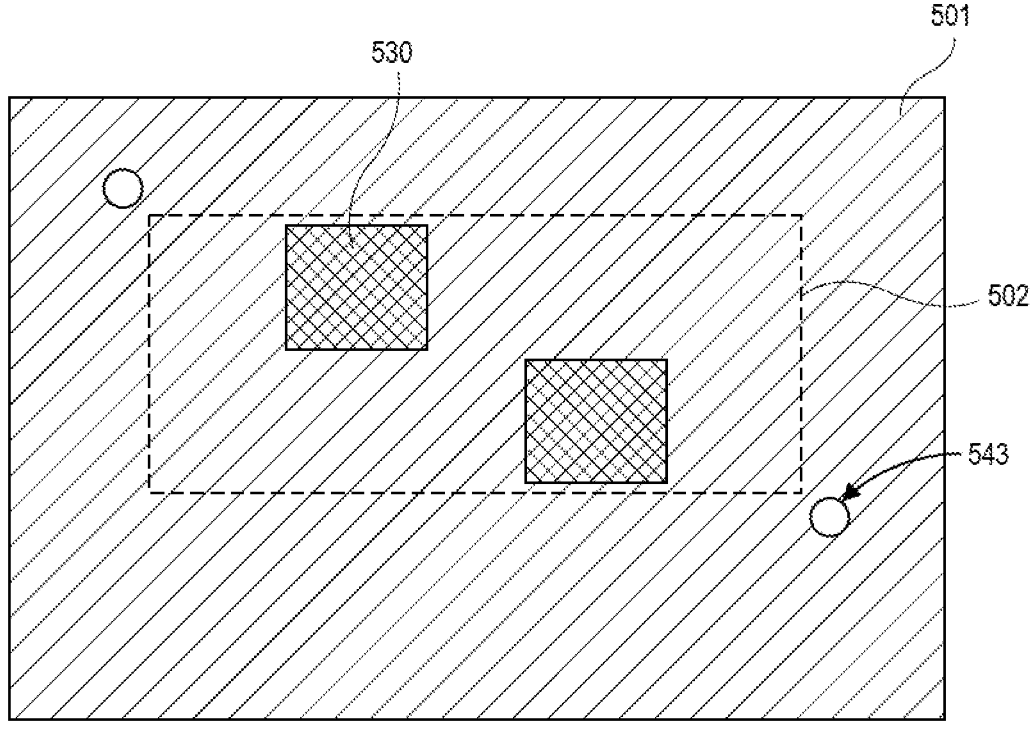
FIG. 5F is a plan view illustration of the board with ground pads exposed, in accordance with an embodiment.

Referring now to FIG. 5F, a plan view illustration of the board 501 after conductive features 530 are provided over the surface of the board within a device area 502 is shown, in accordance with an embodiment. The device area 502 may be the area of the board 501 that will ultimately form the motherboard or PCB after completion of the device. The conductive features 530 may be copper or the like. In a particular embodiment, the conductive features 530 are electrically grounded features. The conductive features 530 may be contacted by the adhesive layers 512 of the EMI shield. While a pair of conductive features 530 are shown, it is to be appreciated that any number of conductive features 530 may be provided within the device area 502.

Figure 5G:
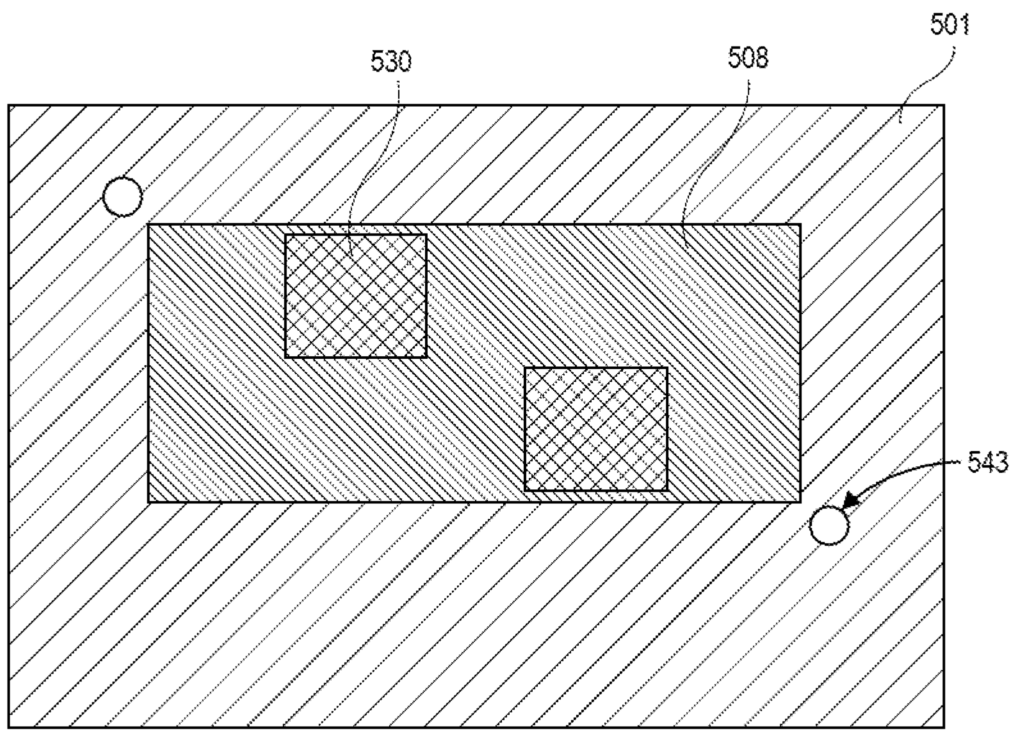
FIG. 5G is a plan view illustration of the board after a solder resist is applied over the board, in accordance with an embodiment.

Referring now to FIG. 5G, a plan view illustration of the board 501 after a solder resist 508 is applied is shown, in accordance with an embodiment. In an embodiment, the solder resist 508 may be applied with a lamination process, a printing process, or the like. After the solder resist 508 is applied, the solder resist 508 may be patterned in order to expose the conductive features 530. The solder resist 508 may also cover additional conductive routing (not shown) on the board 501 in some embodiments.

Figure 5H:
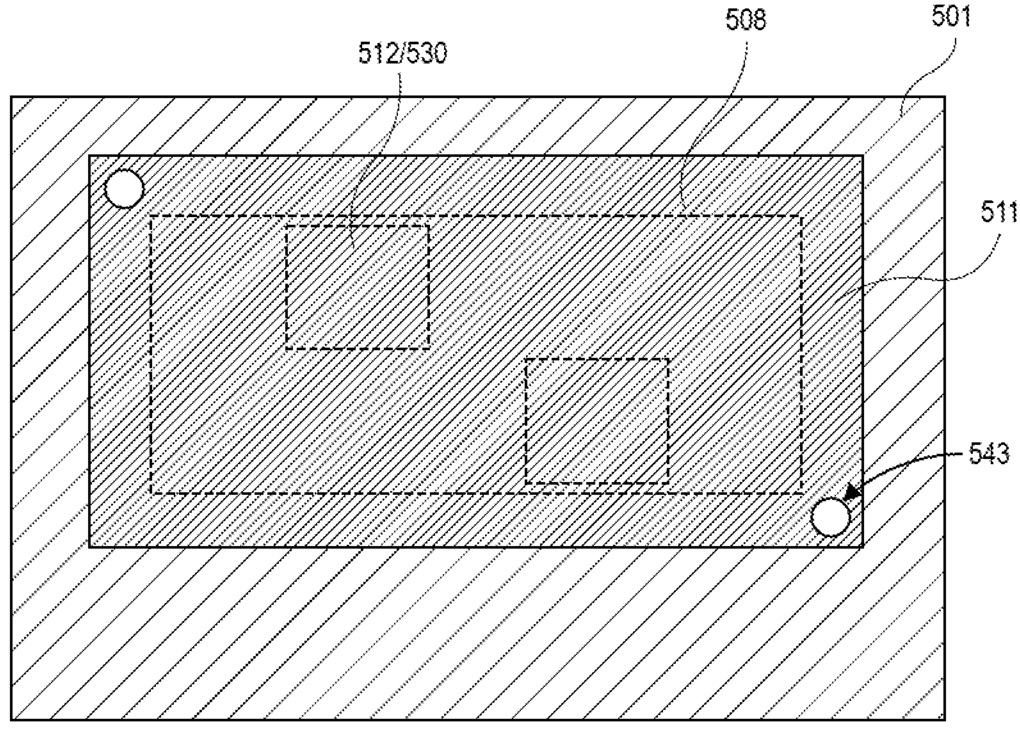
FIG. 5H is a plan view illustration of the board after the carrier is mounted to the board, in accordance with an embodiment.

Referring now to FIG. 5H, a plan view illustration of the board 501 after the multi-layer EMI shield is applied over the board 501 is shown, in accordance with an embodiment. The carrier 511 of the EMI shield is shown over the solder resist 508 in FIG. 5H. Additionally, the alignment holes 542 may be aligned with the alignment holes 543. As indicated by the dashed lines, adhesive layers 512 may be provided over the conductive features 530.

In an embodiment, the multi-layer EMI shield may first be baked before being applied to the board 501. For example, the shield may be baked at approximately 135 degrees Celsius for up to one hour or longer before being applied to the board 501. The baking process may be used to drive off any moisture in the shield. After an initial baking, the shield may be applied to the board 501 with a hot pressing process. The hot press may include a temperature up to approximately 120 degrees Celsius for a duration up to approximately one minute, up to approximately thirty seconds, or up to approximately five seconds. The hot pressing process may be performed at a pressure up to approximately 1 MPa or up to approximately 0.5 MPa. After the initial hot pressing, the alignment is checked, and a main press is implemented. The main press may be done at a temperature up to approximately 200 degrees Celsius, or up to approximately 170 degrees Celsius. The main press may be implemented for a duration of up to approximately one hour, or up to approximately thirty minutes. The pressure of the main press may be up to approximately 5 MPa, or up to approximately 3 MPa.

Figure 5I:
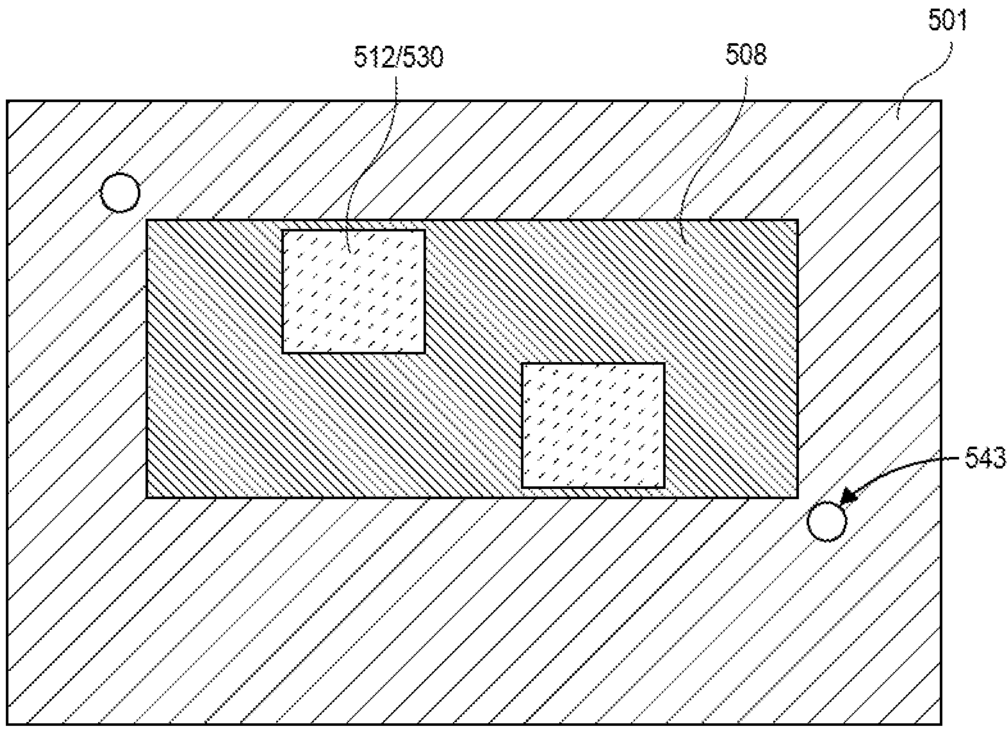
FIG. 5I is a plan view illustration of the board after the carrier is released, in accordance with an embodiment.

Referring now to FIG. 5I, a plan view illustration of the board 501 after the carrier film 511 is removed is shown, in accordance with an embodiment. In an embodiment, removal of the carrier film 511 may be done with a peeling process or the like. After the carrier film 511 is removed the multi-layer EMI shield remains on the conductive features 530. For example, an electrically conductive adhesive may electrically couple the conductive features 530 to a metallic layer that provides the shielding. An electrically insulating base layer may be provided over the metallic layer. After removal of the carrier film 511, another baking process may be implemented to drive off moisture. For example, the baking process may be up to approximately 135 degrees Celsius for up to approximately one hour.

Figure 5J:
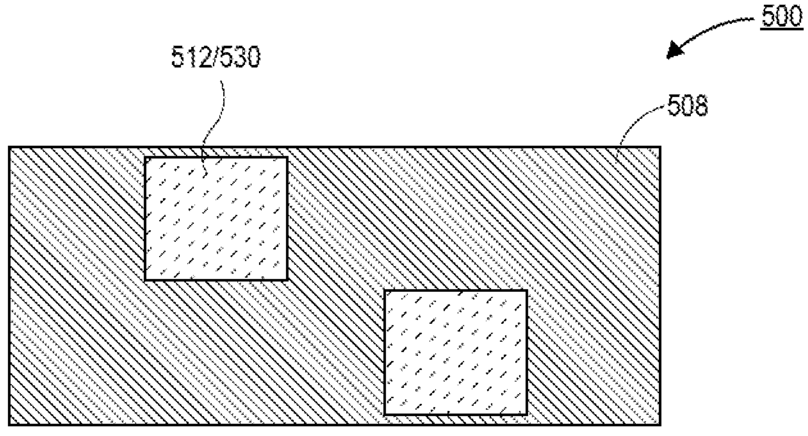
FIG. 5J is a plan view illustration of the board after the board is singulated, in accordance with an embodiment.

Referring now to FIG. 5J, a plan view illustration of the PCB 500 is shown, in accordance with an embodiment. The PCB 500 may be singulated from the board 501 with any suitable singulation process, such as mechanical sawing/drilling, laser ablation, etching, or the like.

Figure 6:
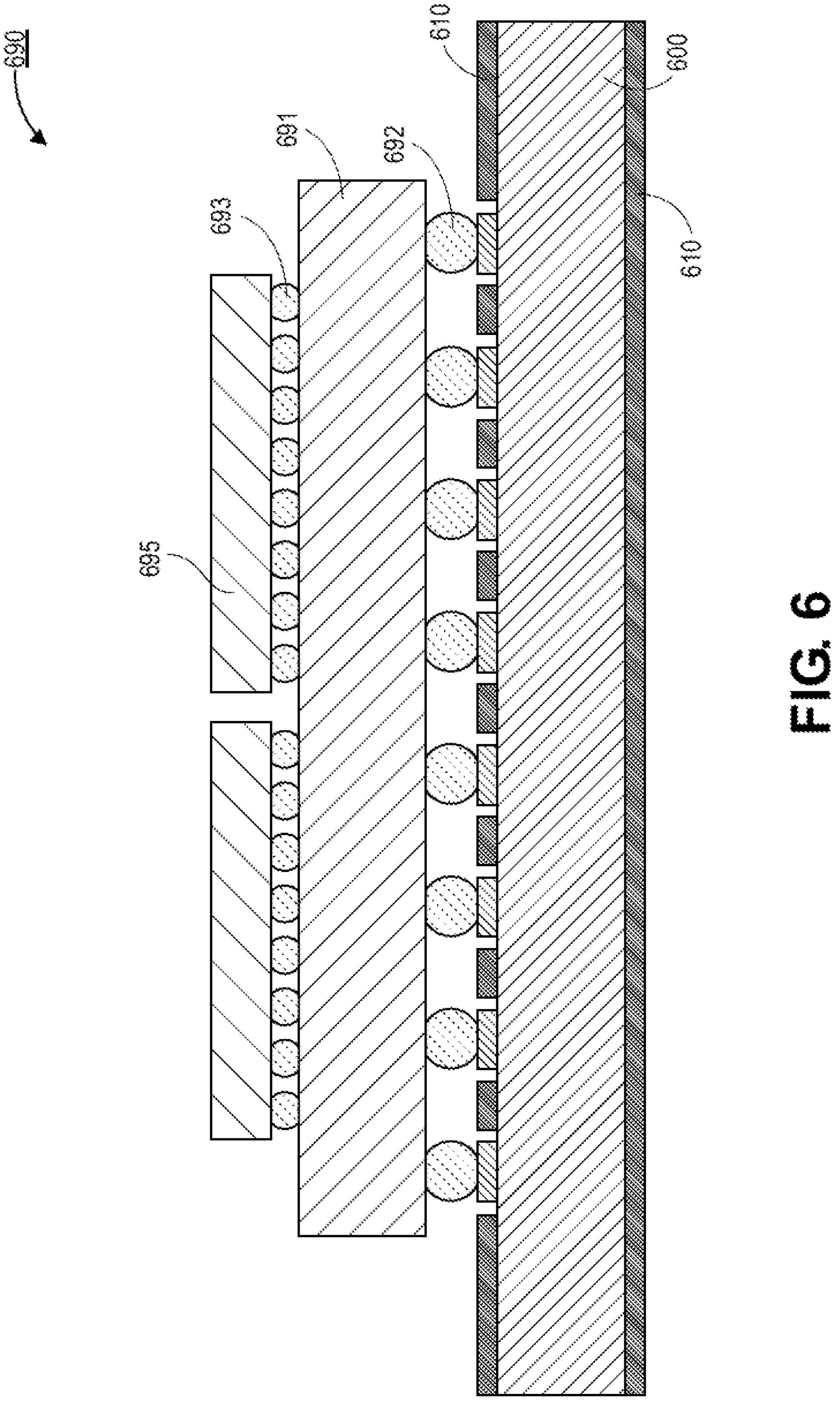
FIG. 6 is a cross-sectional illustration of a computing system with a board that includes a multi-layer EMI shield over top and bottom surfaces of the board, in accordance with an embodiment.

Referring now to FIG. 6, a cross-sectional illustration of a computing system 690 is shown, in accordance with an embodiment. In an embodiment, the computing system 690 comprises a board 600, such as a motherboard, a PCB, or the like. In an embodiment, the board 600 may comprise conductive routing layers, insulating layers, solder resist layers, a core, and any other typical board 600 features. In an embodiment, a multi-layer EMI shield 610 may be provided over and/or under the board 600. The shield 610 may include an electrically conductive adhesive, a metallic layer, and an electrically insulating base layer. The conductive adhesive may electrically couple the metallic layer to one or more electrically grounded conductive features on the board 600 in order to provide a high degree of EMI shielding to the board 600. As such, high speed and high switching power shapes can be routed throughout the board 600 including on the outer layers of the board 600. In some embodiments, the shielding may be up to approximately 90%, up to approximately 95%, up to approximately 99%, or even higher.

In an embodiment, a package substrate 691 may be coupled to the board 600 by interconnects 692. The interconnects 692 may include solder balls, sockets, or any other suitable interconnect architecture. The package substrate 691 may include organic buildup layers with (or without) a core, such as an organic core or a glass core.

In an embodiment, one or more dies 695 may be coupled to the package substrate 691 through interconnects 693. The interconnects 693 may comprise solder, copper bumps, or any other suitable first level interconnect (FLI) architecture. In an embodiment the one or more dies 695 may comprise compute dies, such as a central processing unit (CPU), a graphics processing unit (GPU), an XPU, a system on a chip (SoC), a communication die, a memory die, or the like.

Figure 7:
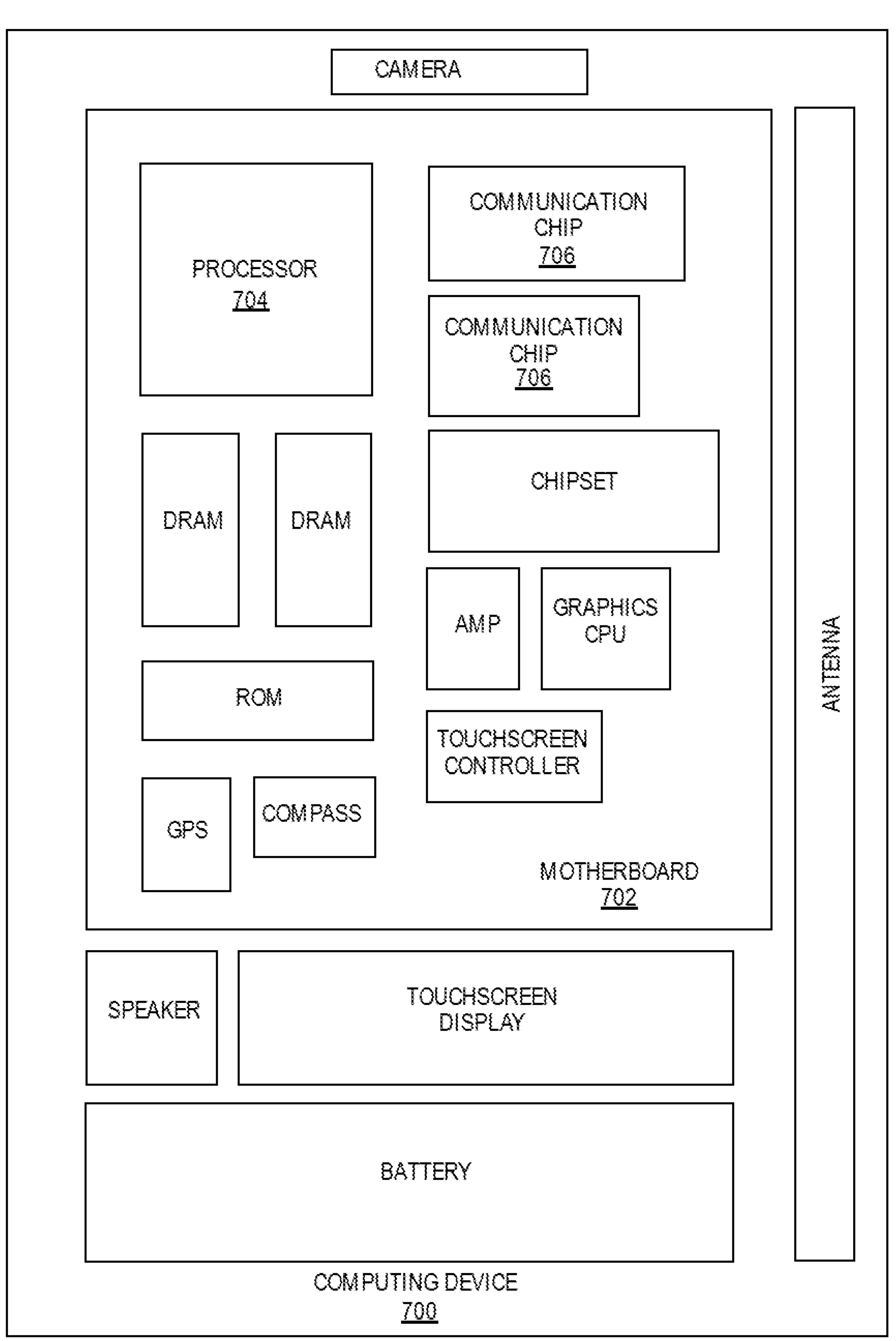
FIG. 7 is a schematic of a computing device built in accordance with an embodiment.

FIG. 7 illustrates a computing device 700 in accordance with one implementation of the invention. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In some implementations of the invention, the integrated circuit die of the processor may be part of an electronic package with a board that includes a multi-layer EMI shield that is electrically coupled to one or more electrically grounded features on the board, in accordance with embodiments described herein. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. In accordance with another implementation of the invention, the integrated circuit die of the communication chip may be part of an electronic package with a board that includes a multi-layer EMI shield that is electrically coupled to one or more electrically grounded features on the board, in accordance with embodiments described herein.

In an embodiment, the computing device 700 may be part of any apparatus. For example, the computing device may be part of a personal computer, a server, a mobile device, a tablet, an automobile, or the like. That is, the computing device 700 is not limited to being used for any particular type of system, and the computing device 700 may be included in any apparatus that may benefit from computing functionality.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: a printed circuit board (PCB), comprising: a core; routing layers over and under the core; and a multi-layer shield over at least one of the routing layers, wherein the multi-layer shield comprises: a metallic layer with a first surface and a second surface opposite from the first surface; a conductive adhesive over the first surface of the metallic layer; and a base layer over the second surface of the metallic layer, wherein the base layer is electrically insulating.

Example 2: the PCB of Example 1, wherein the multi-layer shield is over a bottommost surface of the routing layers.

Example 3: the PCB of Example 1, wherein the multi-layer shield is over a topmost surface of the routing layers.

Example 4: the PCB of Example 1, wherein the multi-layer shield is over a topmost surface of the routing layers and a bottommost surface of the routing layers.

Example 5: the PCB of Examples 1-4, wherein the multi-layer shield has a thickness that is approximately 20 μm or less.

Example 6: the PCB of Example 5, wherein the multi-layer shield has a thickness that is approximately 15 μm or less.

Example 7: the PCB of Examples 1-6, wherein the multi-layer shield further comprises: a reinforcement layer over the base layer.

Example 8: the PCB of Examples 1-7, wherein the conductive adhesive contacts a metallic surface on the at least one of the routing layers.

Example 9: the PCB of Example 8, wherein the metallic surface is a grounded surface.

Example 10: the PCB of Examples 1-9, wherein the multi-layer shield further comprises: a cutout to accommodate attaching one or more discrete components to the routing layers.

Example 11: a printed circuit board (PCB), comprising: a routing layer; a solder resist over the routing layer, wherein an opening in the solder resist exposes a metallic feature in the routing layer; and a multi-layer shield over the solder resist, wherein the multi-layer shield comprises: a conductive adhesive; a metallic layer on the conductive adhesive, wherein the conductive adhesive electrically couples the metallic layer to the metallic feature; and a base layer on the metallic layer, wherein the base layer is an electrically insulating material.

Example 12: the PCB of Example 11, wherein the multi-layer shield has a thickness that is up to approximately 20 μm.

Example 13: the PCB of Example 12, wherein a thickness of the metallic layer is up to approximately 10 μm.

Example 14: the PCB of Examples 11-13, wherein the solder resist comprises a component opening, and wherein the multi-layer shield comprises a shield opening that is substantially aligned with the component opening.

Example 15: the PCB of Examples 11-14, wherein the multi-layer shield is on a sidewall of the solder resist and a top surface of the solder resist.

Example 16: the PCB of Examples 11-15, wherein the metallic layer comprises copper.

Example 17: the PCB of Examples 11-16, wherein the metallic feature is grounded.

Example 18: a computing system, comprising: a board, wherein the board comprises: an electromagnetic interference (EMI) shield that includes a metallic layer and an electrically conductive adhesive that electrically couples the metallic layer to an electrical ground of the board; a package substrate coupled to the board; and a die coupled to the package substrate.

Example 19: the computing system of Example 18, wherein the EMI shield is provided over the board, under the board, or both over and under the board.

Example 20: the computing system of Example 18 or Example 19, wherein the computing system is part of a personal computer, a server, a mobile device, a tablet, or an automobile.

What is claimed is:

1. A printed circuit board (PCB), comprising:

a core;

routing layers over and under the core; and a multi-layer shield over at least one of the routing layers, wherein the multi-layer shield comprises:

a metallic layer with a first surface and a second surface opposite from the first surface;

a conductive adhesive over the first surface of the metallic layer; and a base layer over the second surface of the metallic layer, wherein the base layer is electrically insulating.

2. The PCB of claim 1, wherein the multi-layer shield is over a bottommost surface of the routing layers.

3. The PCB of claim 1, wherein the multi-layer shield is over a topmost surface of the routing layers.

4. The PCB of claim 1, wherein the multi-layer shield is over a topmost surface of the routing layers and a bottommost surface of the routing layers.

5. The PCB of claim 1, wherein the multi-layer shield has a thickness that is approximately 20 μm or less.

6. The PCB of claim 5, wherein the multi-layer shield has a thickness that is approximately 15 μm or less.

7. The PCB of claim 1, wherein the multi-layer shield further comprises:

a reinforcement layer over the base layer.

8. The PCB of claim 1, wherein the conductive adhesive contacts a metallic surface on the at least one of the routing layers.

9. The PCB of claim 8, wherein the metallic surface is a grounded surface.

10. The PCB of claim 1, wherein the multi-layer shield further comprises:

a cutout to accommodate attaching one or more discrete components to the routing layers.

11. A printed circuit board (PCB), comprising:

a routing layer;

a solder resist over the routing layer, wherein an opening in the solder resist exposes a metallic feature in the routing layer; and a multi-layer shield over the solder resist, wherein the multi-layer shield comprises:

a conductive adhesive;

a metallic layer on the conductive adhesive, wherein the conductive adhesive electrically couples the metallic layer to the metallic feature; and a base layer on the metallic layer, wherein the base layer is an electrically insulating material.

12. The PCB of claim 11, wherein the multi-layer shield has a thickness that is up to approximately 20 μm.

13. The PCB of claim 12, wherein a thickness of the metallic layer is up to approximately 10 μm.

14. The PCB of claim 11, wherein the solder resist comprises a component opening, and wherein the multi-layer shield comprises a shield opening that is substantially aligned with the component opening.

15. The PCB of claim 11, wherein the multi-layer shield is on a sidewall of the solder resist and a top surface of the solder resist.

16. The PCB of claim 11, wherein the metallic layer comprises copper.

17. The PCB of claim 11, wherein the metallic feature is grounded.

18. A computing system, comprising:

a board, wherein the board comprises:

an electromagnetic interference (EMI) shield that includes a metallic layer and an electrically conductive adhesive that electrically couples the metallic layer to an electrical ground of the board;

a package substrate coupled to the board; and a die coupled to the package substrate.

19. The computing system of claim 18, wherein the EMI shield is provided over the board, under the board, or both over and under the board.

20. The computing system of claim 18, wherein the computing system is part of a personal computer, a server, a mobile device, a tablet, or an automobile.

* * * * *